(12) United States Patent
Abele et al.

(10) Patent No.: US 10,365,477 B2
(45) Date of Patent: Jul. 30, 2019

(54) REFLECTIVE DEVICE TO SCAN LIGHT TO PROJECT AN IMAGE ON A DISPLAY SURFACE

(75) Inventors: Nicolas Abele, Demoret (CH); Faouzi Khechana, Preverenges (CH); Julien Gamet, Saint Pierre d'Allevard (FR)

(73) Assignee: North Inc., Kitchener, ON (CA)

( * ) Notice: Subject to any disclaimer, the term of this patent is extended or adjusted under 35 U.S.C. 154(b) by 197 days.

(21) Appl. No.: 14/007,226

(22) PCT Filed: Mar. 14, 2012

(86) PCT No.: PCT/EP2012/054412
§ 371 (c)(1),
(2), (4) Date: Sep. 24, 2013

(87) PCT Pub. No.: WO2012/130612
PCT Pub. Date: Oct. 4, 2012

(65) Prior Publication Data
US 2014/0016169 A1 Jan. 16, 2014

Related U.S. Application Data

(60) Provisional application No. 61/467,478, filed on Mar. 25, 2011.

(51) Int. Cl.
*G02B 26/08* (2006.01)
*G02B 26/10* (2006.01)
(Continued)

(52) U.S. Cl.
CPC .......... *G02B 26/105* (2013.01); *B81B 3/0072* (2013.01); *B81B 7/0025* (2013.01);
(Continued)

(58) Field of Classification Search
CPC .... G02B 26/085; G02B 26/08; G02B 26/105; G02B 26/101; G02B 6/358; G02B 6/3512;
(Continued)

(56) References Cited

U.S. PATENT DOCUMENTS 6,388,789 B1 * 5/2002 Bernstein .............. B81B 3/0021
359/198.1
6,473,274 B1 * 10/2002 Maimone ............. G11B 5/5552
360/294.5
(Continued)

FOREIGN PATENT DOCUMENTS

| JP | 2003029176 A | 1/2003 |
|---|---|---|
| WO | 9502838 A1 | 1/1995 |
| WO | 0225349 A2 | 3/2002 |

*Primary Examiner* — Mustak Choudhury
(74) *Attorney, Agent, or Firm* — Thomas Mahon

(57) ABSTRACT

A reflective device including a movable element which has a reflective surface, wherein the movable element can oscillate about at least one oscillation axis to scan light; one or more holder elements which co-operate with the movable element to hold the movable element in a manner which will allow the movable element to oscillate about the at least one oscillation axis to scan light, wherein the one or more holder elements are configured to define a region which can receive at least a portion of the movable element as the movable element oscillates when the reflective device is mounted on a surface; a magnetic element which is secured to a fixed part of the reflective device; one or more electrically conductive means positioned on the movable element so that one or more electrically conductive means can operatively co-operate with a magnetic field provided by the magnetic element to effect oscillation of the moveable element, wherein the one or more electrically conductive means are completely embedded in the movable element. There is further provided a projection device having such a reflective (Continued)

device and a corresponding method of manufacturing a reflective device.

17 Claims, 12 Drawing Sheets

(51) Int. Cl.
    *G02B 26/12*     (2006.01)
    *B81B 3/00*     (2006.01)
    *B81B 7/00*     (2006.01)

(52) U.S. Cl.
    CPC ...... *G02B 26/085* (2013.01); *B81B 2201/042* (2013.01); *B81B 2203/0109* (2013.01); *B81B 2203/04* (2013.01); *Y10T 29/49002* (2015.01)

(58) Field of Classification Search
CPC .. G02B 6/3556; G02B 6/3572; G02B 6/3584; B81B 3/0072; B81B 7/0025; B81B 3/0021; B81C 1/0023; B81C 1/00134; B81C 1/00214; B81C 1/00261
USPC ... 359/1, 15, 32, 199.1, 199.3, 200.7, 212.1, 359/213.1, 214.1, 566, 569, 900; 438/23–34, 57, 67–78; 335/222; 385/14, 385/147, 20, 901
See application file for complete search history.

(56) References Cited

U.S. PATENT DOCUMENTS

| | | | |
|---|---|---|---|
| 2002/0186918 A1* | 12/2002 | Burroughs | G02B 6/3588 385/18 |
| 2008/0007376 A1* | 1/2008 | Jeong | G02B 26/085 335/222 |

\* cited by examiner

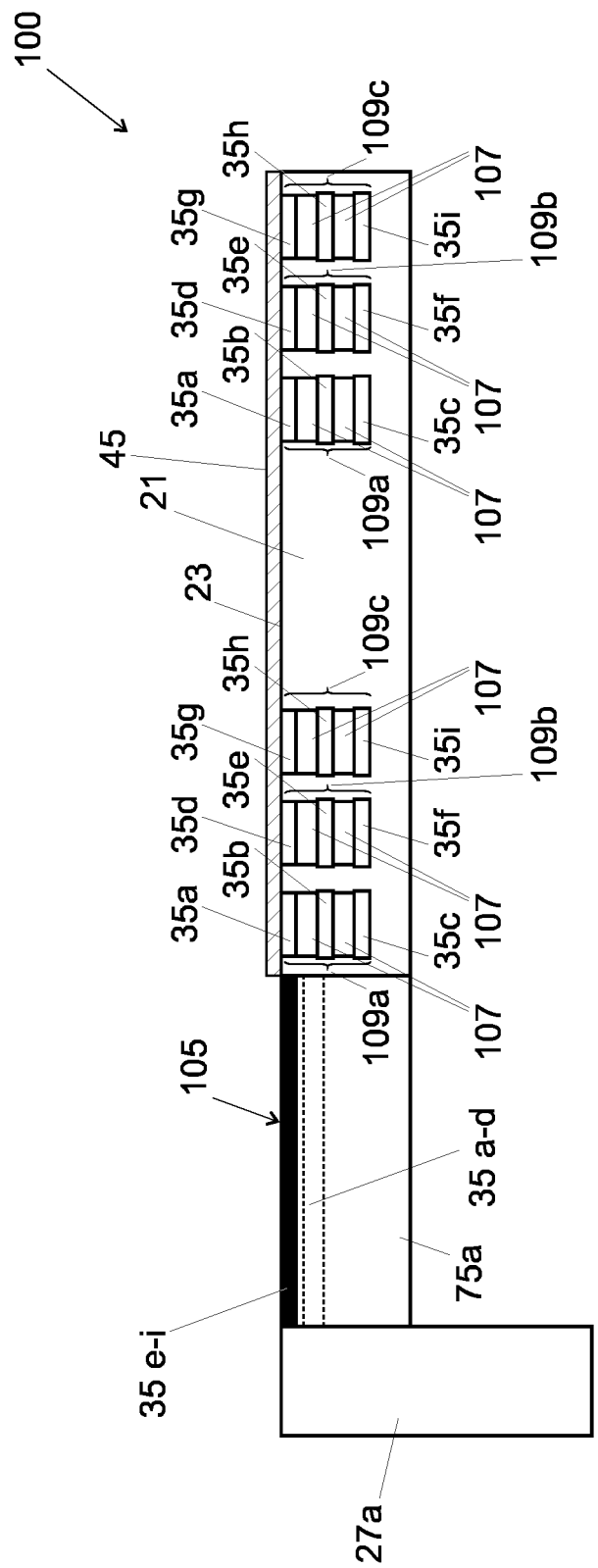

REFLECTIVE DEVICE TO SCAN LIGHT TO PROJECT AN IMAGE ON A DISPLAY SURFACE

FIELD OF THE INVENTION

The present invention relates to a reflective device, in particular a reflective device which is operable to scan light to enable projection of an image on a display screen.

BACKGROUND TO THE INVENTION

Scanning MEMS mirror devices comprise a moveable element which comprises a reflective portion. The movable portion is held by one or more holders which hold the moveable portion in a manner which allows the movable portion to oscillate about an oscillation axis. During operation of the scanning MEMS mirror device, the moveable element is oscillated about one or two oscillation axis so that the reflective portion scans light.

The manner in which oscillation of the moveable element is effected varies. Usually it is achieved by means of an electrically conducting coil and a magnet. Either the magnet, or the coil, is position on the movable element, while the other is positioned at a stationary portion of the scanning MEMS mirror device e.g. on the holders. Current is passed through the coil; the magnetic field which is generated by the magnet interacts with the current carrying coil and this forces the movable portion to oscillate about one or two oscillation axis.

Disadvantageously, placing the magnet on the movable element, increases the size and mass of the movable element. Thus, more power is required to oscillate the movable element. Furthermore, the increase in mass will increase the inertia of the moveable portion making it more difficult to oscillate the movable element at a high frequency. If the scanning MEMS mirror device is used in a projector, then oscillating the movable element at a lower frequency will reduce the resolution of the projected image. Furthermore, the size of the magnet is limited by the size movable element; a smaller magnet generates a smaller magnetic field. The smaller the magnetic field the more current which is required to flow in the coil to effect oscillation of the movable element. Thus, the limited size of the magnet which can be provided on the movable element increases the overall power required to effect oscillation of the movable element.

Accordingly, positioning the magnet on the movable element has three main disadvantages; the size of the magnet is limited by the size of the movable element, it increases the mass of the movable element which in turn means that more power is required to oscillate the movable element, and it also increases the inertia of the movable element which makes it more difficult to oscillate the movable element at a high frequency. The provision of a magnet on the movable element of a scanning MEMS mirror is known from DE19803857.

To overcome the above-mentioned problems it is known to provide the magnet on a fixed portion of the scanning MEMS mirror device e.g. on the holders, and to provide the current carrying coil(s) on the moveable element. Such an arrangement is disclosed in WO0218979 and KR20080096090. However the solution proposed in each of these patent applications have disadvantages associated with them.

WO0218979 discloses providing a scanning MEMS mirror device in which has the current carrying coil and a reflective portion are both provided on the same surface of the movable element. As a result the reflective portion does not cover the whole surface of the moveable element. Consequently, only a fraction of the whole area of the surface of the moveable element can be used to reflect and scan light. This reduces the size of the laser spot light which can be reflected and scanned by the scanning MEMS mirror device.

To address this problem it is known to provide the coils on an under-surface of the moveable element. However, due to manufacturing constraints this is very difficult to achieve; in particular, the aspect ratio of an area defined by the holder and moveable element, make it impossible to uniformly and accurately provide coils at the under-surface of the movable element. FIG. 1 provides a cross-sectional view of a scanning 2D MEMS mirror device 10 according to the prior art, in its manufacturing stage (before the device 10 has been provided with a coil). The scanning MEMS mirror device 10 comprises a holder 1 and moveable element 2 (the element 2 can oscillate about two orthogonal oscillation axes; only one oscillation axis 13 is shown). The holder 1 and the movable element 2 define a region 3; the region 3 provides sufficient space to allow the movable element 2 to oscillate about oscillation axis 13. However, region 3 has a large aspect ratio, the large aspect ratio of the region 3 makes it impossible to uniformly deposit material on an under-surface 5 of the moveable element 2. The dashed line 7, shown in FIG. 1, illustrates that a "liquid border effect" results at inner surfaces 9 of the holder 1 if material 11 is deposited on the under-surface 5. The aspect ratio of the region 3 also makes is impossible to uniformly etch any deposited material. Thus, the large aspect ratio of region 3 makes it impossible to deposit material and etch material on under-surface 5 of the moveable element 5 to provide a uniform coil.

The scanning MEMS mirror device provided in KR20080096090 proposes a solution which enables the provision of coils on an under-surface of the moveable element in a scanning MEMS mirror. In the scanning MEMS mirror of KR20080096090 the size of the moveable element is increased so that it matches the size of the holder(s); accordingly the issues associated with the aspect ratio mentioned above are eliminated and the under-surface of the moveable element is now readily available for deposition and etching of material thereon to from a uniform coil. However, as the size of the moveable element matches the size of the holder, when the scanning MEMS mirror device is mounted on a surface, the moveable element will not be able to oscillate. To enable the moveable element to oscillate, additional spacer elements will be required (e.g. applied between the holder(s) and the surface on which the scanning MEMS mirror device is mounted) so as to provide region, between the scanning MEMS mirror device and the surface on which it is mounted, which can receive at least a portion of the moveable element as the movable element oscillates.

It is an aim of the present invention to obviate or mitigate one or more of the aforementioned disadvantages.

SUMMARY OF THE INVENTION

According to a first aspect of the present invention there is provided a reflective device comprising,
a movable element which comprises a reflective surface, wherein the movable element can oscillate about at least one oscillation axis to scan light;
one or more holder elements which co-operate with the movable element to hold the movable element in a manner which will allow the movable element to oscillate about the at least one oscillation axis to scan light, wherein the one or more holder elements are configured to define a region which can receive at least a portion of the movable element as the movable element oscillates when the reflective device is mounted on a surface;

a magnetic element which is secured to a fixed part of the reflective device;

one or more electrically conductive means positioned on the movable element so that one or more electrically conductive means can operatively co-operate with a magnetic field provided by the magnetic element to effect oscillation of the moveable element, wherein the one or more electrically conductive means are completely embedded in the movable element.

Preferably at least a portion of the length of the one or more electrically conductive means are completely embedded in the movable element so that the reflective surface can define a whole surface of the moveable element.

"Completely embedded in the moveable element" means that at least a portion of the length of the electrically conductive means is fully contained within the moveable element.

Embedding the one or more electrically conductive means in the moveable element has a number of advantages including:

The electrically conductive means are not exposed to air, therefore avoiding corrosion problems;

The stress impact from the electrically conductive means on the reflective surface flatness (e.g. mirror flatness) can be reduced;

The electrically conductive means can be distributed so that stresses created in the moveable element by the electrically conductive means can compensate for each other (either both tensile or both compressive);

Both the whole surface of the upper and lower side of the moveable element can be provided with a reflective layer so that the whole upper and lower surface of the moveable element can be provided with a reflective surface;

Multiple layers of electrically conductive means e.g. multiple layers of coils, can be easily provided in cooperation with the moveable element by embedding the electrically conductive means, therefore providing better actuation force/power ratio;

The risk of short circuit occurring in the electrically conductive means resulting from mechanical ageing (due to the torsion for example), is reduced.

The reflective device may comprise a reflective layer. The reflective layer may define the reflective surface. The one or more electrically conductive means may be completely embedded in the movable element so that a whole surface of the moveable element can be defined by the reflective layer.

The reflective device may be suitable for use in a projection system. The reflective device may be suitable for use in a projection device.

As the one or more electrically conductive means are completely embedded in the movable element, the whole surface of the movable element can be provided with a reflective surface which is usable to reflect light of a laser. Thus, the surface area of the movable element which can be used reflect light is maximised. Accordingly, the spot light size of the laser which can be reflected by the reflective device is maximised. Ultimately, when the reflective device of the present invention is used in a projection system or projection device, an increase in the brightness of projected images (which are projected on a display screen for example) can be achieved because of the ability of the reflective element to reflect a larger spot light size. The reflection of a larger spot light size means that more light is reflected to the display screen, thus a brighter image is displayed on the display screen.

Furthermore, compared to prior art devices which have movable elements in which the whole surface of the movable element does not have a reflective surface, the present invention allows reflection of the light from a laser which has the same spot size, using a smaller sized movable element. As the movable element is smaller in size it has less inertia and therefore can be oscillated at a higher frequency using the same current. When used in a projection device, a faster frequency of oscillation of the movable element enables a higher resolution image to be projected. Alternatively, as the movable element is smaller in size it has less inertia and therefore requires less current to be oscillated at the same frequency; thus reducing the power requirement. Thus, when used in a projection device the same resolution image can be achieved using less power consumption.

Additionally, unlike the scanning MEMS mirror device provided in KR20080096090, the reflective device of the present invention will not require additional spacers as the one or more holder elements are configured to define a region which can receive at least a portion of the movable element as the movable element oscillates when the reflective device is mounted on a surface A whole surface of the movable element may comprise a reflective surface.

The reflective device may be a MEMS micro-mirror device. The moveable element may comprise a MEMS micro-mirror.

"Secured" means directly or indirectly attached; therefore the magnetic element may be directly or indirectly attached to the fixed part of the reflective device. For example, the magnetic element attach directly to the fixed part of the reflective device by means of adhesive; or, a spacer element may be interposed between the magnetic element and the fixed part of the reflective device so that the magnetic element is indirectly attached to the fixed part of the reflective device.

The fixed part to which the magnetic element is secured may be one or more of the one or more holder elements.

The movable element may comprise a silicon component.

The one or more electrically conductive means may be completely embedded in the silicon component.

The one or more electrically conductive means may extend from a surface of the silicon component to a depth which is half the thickness of the silicon component. The one or more electrically conductive means may be arranged such that they are located at a depth which is half the thickness of the silicon component. Arranging the electrically conductive means in any of the aforementioned manners within the silicon component will ensure that less mechanical stresses are created in the movable element due to the electrically conductive means; accordingly warping of the movable element (and thus warping of the reflective layer) due to mechanical stresses, will be reduced.

The one or more electrically conductive means may be arranged such that they are below the reflective surface of the movable element.

The one or more electrically conductive means may comprise one or more coils. The one or more electrically conductive means may take any suitable form. For example, the one or more electrically conductive means may comprise carbon nanotube, copper, gold or any suitable element capable of electrical conduction.

The reflective device may further comprise one or more insulation layers. Preferable the reflective device comprises a first insulation layer. More preferably the reflective device comprises a first and second insulation layer. An insulation layer may be arranged to electrically isolate a silicon substrate in the reflective device from the reflective layer. An insulation layer may be interposed between the silicon substrate and the reflective layer. An insulation layer may be arranged to compensate for stresses created in the movable element. For example the reflective layer or the coil may generate a tensile stress in the movable element, the insulation layer may arranged to generate a compressive stress in the movable element so as to compensate for the tensile stress created by the reflective layer or the coil.

The reflective device may comprise a second moveable element. The second movable element may be configured in the same manner as the moveable element described above. The second movable element may comprise some, or all, of the feature of the moveable element described above.

The reflective device may further comprise arms which connect the one or more holder elements to the movable element. The moveable element may further comprise a frame. The frame may reduce the occurrence of warp in the moveable element as it oscillates about the at least one oscillation axis. The frame may be configured to reduce stress on the electrically conductive means. The arms may connect the holder elements to the frame of the movable element. The arms may be configured to permit the moveable element to oscillate about the at least one oscillation axis to scan light. Preferably the frame is configured so oscillate about a second oscillation axis, wherein the second oscillation axis is orthogonal to a first oscillation axis about which the moveable element can oscillate. This will allow the moveable element to oscillate in two dimensions.

At least part of the length of at least some of the one or more conductive means may be embedded in an arm. Preferably, at least part of the length of each of the one or more conductive means is embedded in an arm. At least part of the length of at least some of the one or more conductive means may be supported on a surface of the arms. The dimensions of each arm may be such that two or more conductive means may be embedded in a single arm, so that, for example, many independent conductive coil on the movable element can be controlled.

The reflective device may comprise a plurality of conducting coils embedded in the moveable element. At least some of the plurality of conducting coils may be embedded in the silicon component of the moveable element. All of the plurality of conducting coils may be embedded in the silicon component of the moveable element. Embedding the conducting coils allows more conductive coils to be provided on the moveable element without having to increase the surface area of the moveable element; it allows more conductive coils on the moveable element for the same silicon area. Providing a plurality of conducting coils provides for a higher actuation forces to oscillate the movable element.

The reflective device may further comprise a plurality of insulating layers. Preferably the reflective device comprises an insulating layer interposed, between each of a plurality of conducting coils. The insulating layers are preferably configured to electrically insulate each of the conducting coils from one another. This allows an increase in the number of conductive coils which can be provided in the movable element which thus provides higher forces which oscillate the moveable element.

The reflective device may comprise an insulating layer. Preferably the reflective device comprises a single insulating layer. The insulating layer may be provided on the moveable element. Preferably the insulating layer is interposed between the reflective layer and silicon component on the moveable element.

One or more conducting coils are embedded in the insulating layer. Preferably one or more conducting coils are embedded in the insulating layer and one or more conducting coils are embedded in the silicon component of the moveable element. The insulating layer is preferably configured to electrically insulate each of the conducting coils from one another.

The movable element of the reflective device may further comprise a second reflective layer which provides a second reflective surface which is usable to deflect light. The movable element may comprise a first and second surface: the first surface may be an upper surface and the second surface may be a lower surface. Preferably the upper surface is defined by the first reflective layer and the lower surface is defined by the second reflective layer. Preferably the upper surface of the moveable element is defined by a reflective surface of the first reflective layer and the lower surface of the moveable element is defined by a reflective surface of the second reflective layer so that the whole upper and lower surfaces of the movable element are usable to deflect light.

The reflective device may further comprise a laser source and photodiode, wherein the laser source is arranged to transmit laser light to the second reflective surface on the moveable element and the photodiode is arranged to receive light reflected from the second reflective surface so that the position of the moveable element can be determined. The intensity of light received by the photodiode is indicative of the position of the moveable element, therefore the position/angular orientation of the moveable element can be determined from the light measured by the photodiode.

The reflective device may comprise a plurality of conducting coils which are distributed evenly through-out the moveable element. Preferably, the reflective device comprises a plurality of conducting coils which are distributed evenly through-out a thickness of a silicon component of the moveable element. The reflective device may comprise one or more conducting coils located proximate to a first surface of the movable element and one or more conducting coils located proximate to a second surface of the movable element. The first surface may be an upper surface and the second surface may be a lower surface.

Preferably the one or more conducting coils are arranged such that they extend over the whole cross sectional area of the moveable element. Most preferably the one or more conducting coils are arranged such that they are distributed over substantially the whole cross sectional area of the moveable element.

The reflective layer may be configured to have one or more diffractive gratings. The reflective layer may be configured to act as a Bragg filter. A semi-transparent layer (such as a layer of silicone oxide, silicon nitride, titanium oxide etc. . . . ) may be provided on the reflective layer, so that the reflective layer is configured as a bragg filter. Preferably the semi-transparent layer is be provided on top of the reflective layer. Adding a semi-transparent layer on top of the reflective layer is compatible with the reflective layer as the resulting bragg filter will filter out wavelengths which are not desirable to reflect. The reflective layer may comprise an coating configured to reflect light of a predetermined wavelength; the coating may comprise single or multi-layers The reflective layer may comprise photonic crystals. The reflective layer may comprise photonic crystals which configure the reflective layer such that it can perform optical filtering or act as a waveguide.

The reflective device may further comprise a spacer element. The spacer element may be provided on the moveable element. The moveable element may comprise the spacer element. The spacer element is preferably interposed between the reflective layer and the silicon component. The spacer element may be arranged such that it is supported on at least a part of the movable element. The spacer element may be configured to define a cavity in which one or more conducting coils are housed. The one or more conducting coils may be attached to an inner surface of the spacer element. Preferably, the reflective device comprises one or more conducting coils which are attached to an inner surface of the spacer element comprises and one or more conducting coils which cooperate with the silicon component of the moveable element. The reflective device may comprise one or more conducting coils which are attached to an inner surface of the spacer element and one or more conducting coils which are embedded in the silicon component of the moveable element. The reflective device may comprise one or more conducting coils which are attached to an inner surface of the spacer element comprises and one or more conducting coils which are attached to an upper surface of the silicon component of the moveable element. As the conducting coils are completely contained within the cavity defined by the spacer element, the conducting coils can be considered to be completely embedded within the moveable element.

The spacer element is preferably configured such that an inner height "h" of the cavity is sufficient such that an air gap exists between the one or more conducting coils which are attached to the inner surface of the spacer element and the one or more conducting coils which cooperate with the silicon component of the moveable element. Alternatively, it is possible that no air gap is provided between the one or more conducting coils which are attached to the inner surface of the spacer element and the one or more conducting coils which cooperate with the silicon component of the moveable element (i.e. the coils could be touching one another). If the coils touch one another this increases the conducting area and reduces the electrical resistance of the conducting coils.

The reflective layer is preferably provided on a surface of the spacer element. The reflective layer is preferably provided on an outer surface of the spacer element.

According to a further aspect of the present invention there is provided a projection device comprising a reflective device according to any one of the above-mentioned reflective devices.

According to a further aspect of the present invention there is provided a method of manufacturing a reflective device which comprises a movable element which can oscillate about at least one oscillation axis to scan light, the method comprising the steps of, providing a substrate; embedding one or more electrically conductive means in the substrate; providing a surface of the substrate with a reflective material to provide the substrate with a reflective surface, wherein the reflective surface is arranged to overlay the one or more electrically conductive means.

The method may further comprise the step of processing the substrate to define a moveable element. Processing the substrate may also define a one or more holding members.

The method of manufacturing a reflective device may comprise the step of providing one or more channels in the substrate; providing one or more electrically conductive means in the one or more channels. The step of defining one or more channels in the silicon wafer may comprise carrying out at least one of, photolithography, hard mask deposition, patterning and/or silicon etching. The step of providing an electrically conducting means in the one or more channels, may comprise at least one of the following steps; electro-deposition of copper or of an alloy containing copper; electro-deposition of gold or of an alloy containing gold; electroplating of copper or of an alloy containing copper; electroplating of gold or of an alloy containing gold; sputtering of copper or of an alloy containing copper; sputtering of gold or of an alloy containing gold; evaporation of copper or of an alloy containing copper; evaporation of gold or of an alloy containing gold; carbon nanotube deposition; or growing of a conducting means.

The method may further comprise the step of,
etching the substrate to define a movable element which can oscillate about at least one oscillation axis to scan light, and to define one or more holder elements which co-operate with the movable element to hold the movable element in a manner which will allow the movable element to oscillate about the at least one oscillation axis, wherein the one or more holder elements are configured to define a space in which the movable element can oscillate when the reflective device is mounted on a surface.

The method may comprise the steps of,
providing a silicon wafer;
defining one or more channels in the silicon wafer;
providing electrically conducting means in the one or more channels;
depositing an insulating material on a surface of the silicon wafer and on a surface of the electrically conducting means to form a first insulating layer;
patterning the first insulating layer to expose at least a portion of the electrically conducting means;
depositing a metallic material on a surface of the insulating layer and on a surface of the exposed portion(s) of the electrically conducting means, to form a metal layer;
patterning the metal layer to expose at least a portion of the first insulating layer;
depositing a reflective material on a surface of the metal layer and on a surface of the exposed portion(s) of the first insulating layer, to form a reflective layer;
etching the silicon wafer from a front side thereof and from a backside thereof to define a movable element and one or more holder elements.

The method may further comprise the step of polishing the silicon wafer and electrically conducting means. The step of polishing may be replaced by etching the silicon wafer and electrically conducting means. It should be understood that the polishing step may not be required in the case that the reflective layer is self-levelling or in applications where a flat reflective surface is not required.

The method may further comprise the step of depositing a protective layer on the reflective layer.

The method may further comprise the step of providing a second insulation layer interposed between the reflective layer and the metal layer and interposed between the reflective layer and the exposed first insulating layer.

The method may further comprise the step of providing a second insulation layer. A second insulation layer may be arranged such that it is interposed between the reflective layer and the metal layer and interposed between the reflective layer and the exposed first insulating layer. The method may further comprise the step of depositing insulating material on a surface of the first insulating layer, to provide a second insulation layer.

BRIEF DESCRIPTION OF THE DRAWINGS

An embodiment of the invention will now be described by way of example only, with reference to the accompanying drawings in which, FIG. 1 provides a cross sectional view of a reflective device according to the prior art, in a manufacturing stage;

FIGS. 2b and 2c provide a perspective view and further cross sectional view, respectively, of the reflective device shown in FIG. 2a;

FIG. 3 provides a cross-sectional view of part of reflective device according to another embodiment of the present invention;

DETAILED DESCRIPTION OF THE DRAWINGS

Figure 1:
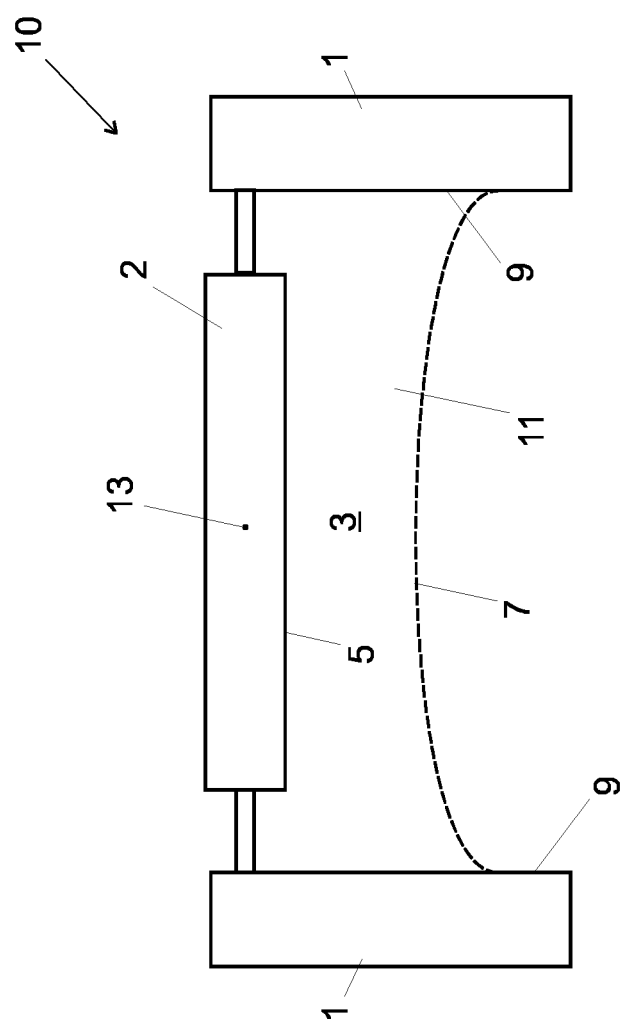
Figure 2A:
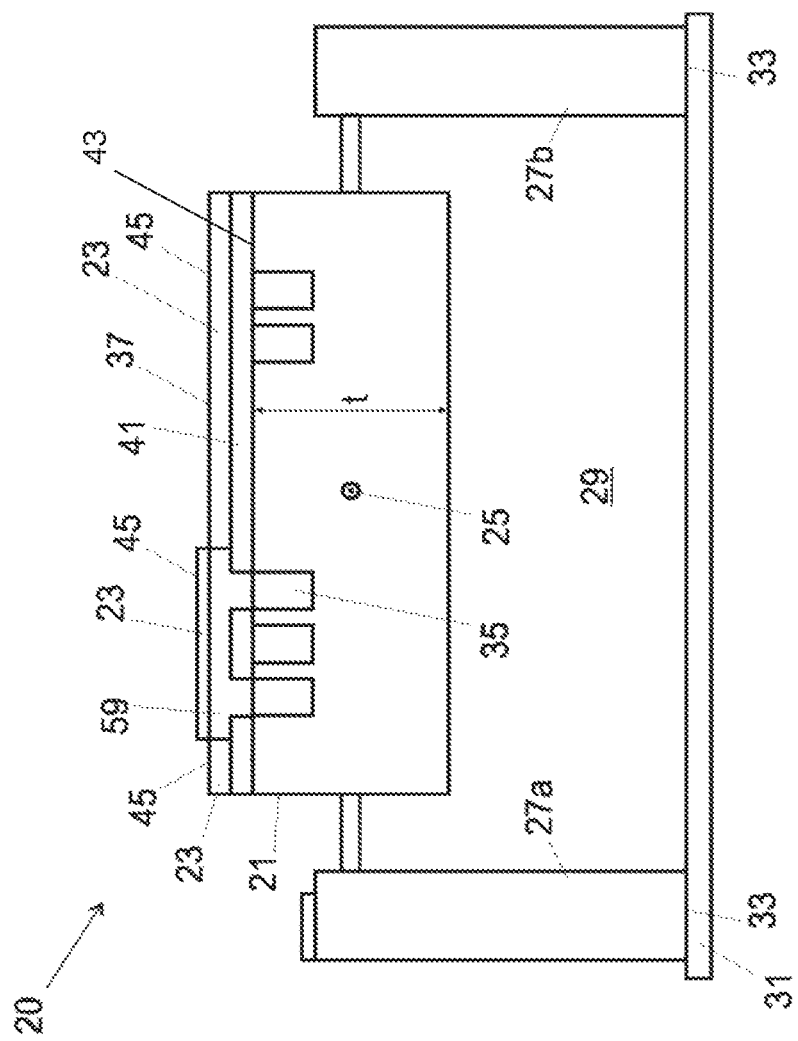
FIG. 2a provides a cross sectional view of a reflective device according to an embodiment of the present invention.

FIG. 2a provides a cross sectional view of a reflective device 20 according to an embodiment of the present invention.

The reflective device 20 comprises a movable element 21. The movable element 21 comprises a reflective layer 23 which provides a reflective surface 45. A whole upper surface 37 of the movable element 21 is defined by the reflective surface 45 so that the whole upper surface 37 of the movable element 21 is usable to deflect light. The movable element 21 is configured so that it can oscillate about an oscillation axis 25 (the oscillations axis is in the plane of the figure, e.g. go through the torsion beams). As will be discussed later with respect of FIG. 2B, the movable element 21 can also oscillate about a second oscillation axis 30 so that the moveable element 21 can oscillate in two dimensions.

Figure 2B:
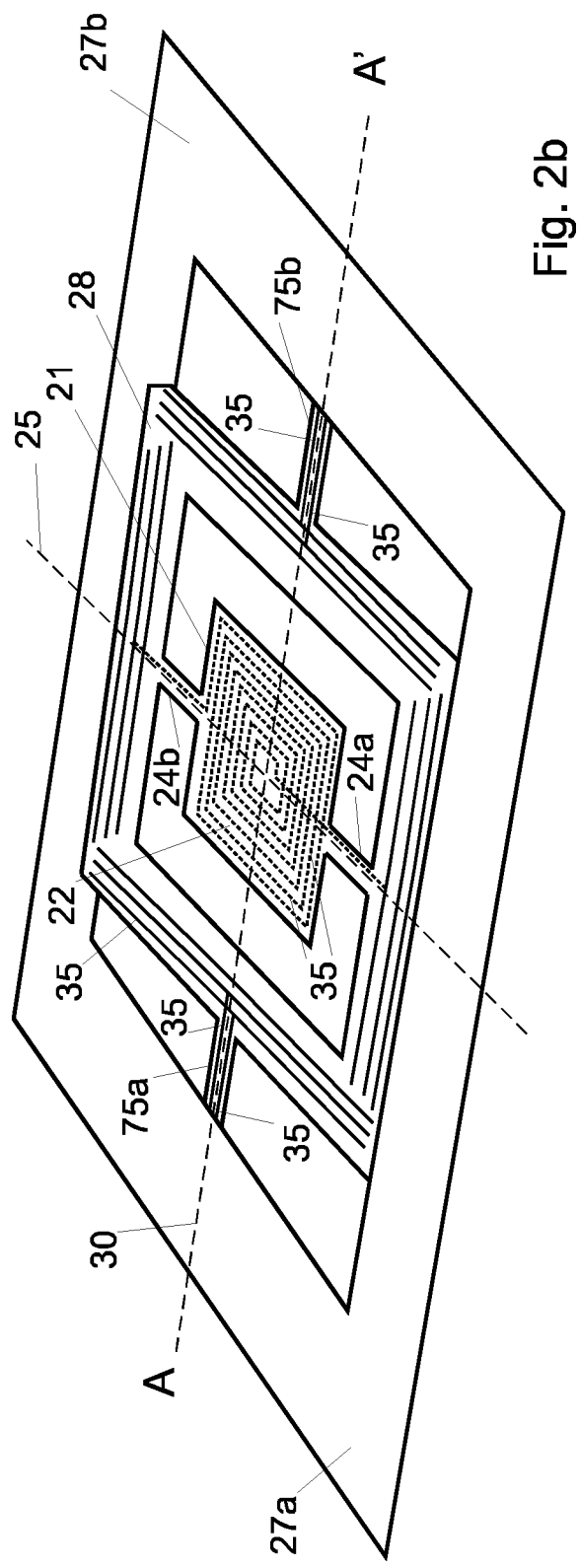

The reflective device 20 comprises holder elements 27a,b which co-operate with the movable element 21 to hold the movable element 21 in a manner which will allow the movable element 21 to oscillate about the oscillation axis 25. As shown in FIG. 2b, the holder elements 27a,b co-operate with the movable element 21 by means of arms 75a,b. The arms 75a,b are configured to permit the moveable element 21 to oscillate about oscillation axis 25. The position of the holder elements 27a,b within the reflective device 20 is fixed.

The holder elements 27a,b are configured to define a region 29. The region 29 can receive at least a portion of the movable element 21 as the movable element 21 oscillates about the oscillation axes 25 and 30; thus when the reflective device 20 is mounted on a surface (such as a surface of a magnetic element) the movable element 21 can freely oscillate about the oscillation axes 25 and 30.

The reflective device 20 further comprises a magnetic element 31 which is secured to a base surface 33 of the holder elements 27a,b. The position of the magnetic element 31 is fixed. It should be noted that the magnetic element 31 could be secured to any other component in the reflective device 20. However, it is preferable that the magnetic element 31 is secured so that it has a fixed position.

The reflective device 20 comprises electrically conductive means in the form of an electrically conductive coil 35. It should be understood that the electrically conductive means may take any suitable form; for example, the electrically conductive means may comprise carbon nanotube, copper, gold or any suitable element capable of electrical conduction. A metal layer 59 electrically connects opposite ends of the conductive coil 35.

At least part of the length of the electrically conducting coil 35, is completely embedded in the movable element 21. It should be noted that any number of conductive coils 35 can be provided in the movable element 21, or any number of layers of coils could be provided, as will be discussed later. The movable element 21 comprises a silicon component 39 with a thickness "t"; the conducting coil 35 is embedded in this silicon component 39. In this particular example the electrically conducting coil 35 is embedded in an upper half of the silicon component 39 so that it extends from a surface 43 of the silicon component to a depth which is approximately half the thickness "t" of the silicon component 39. It should be understood however that the electrically conducting coil 35 could be arranged at any position within the silicon component 39. In fact, preferably the electrically conducting coil 35 is arranged such that it is positioned at a depth which is half the thickness "t" of the silicon component 39. Locating the electrically conducting coil 35 within the silicon component 39, at a depth which is half the thickness "t" of the silicon component 39, will ensure that less mechanical stresses are created in the movable element 21; accordingly warping of the movable element 21 due to mechanical stresses is reduced.

It is important that the electrically conducting coil 35 is arranged in the moveable element 21 in a manner which will allow the electrically conducting coil 35 to operatively co-operate with a magnetic field provided by the magnetic element 31. This is necessary to enable oscillation of the moveable element 21 when current is passed through the electrically conducting coil 35.

Figure 2C:
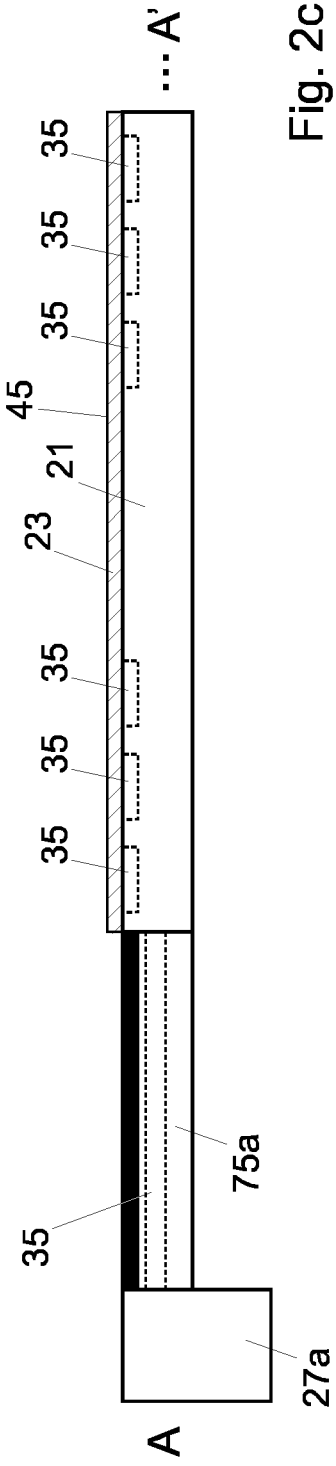

As can be best seen in FIGS. 2b and 2c another part of the length of the conducting coil 35 is embedded in the arms 75a,b. Embedding the conducting coil 35 in the arms 75a,b provides more mechanical stability for the conducting coil 35, it also reduces the risk of short circuit due to electromigration of particles from the conducting coil 35 or due to mechanical deformation of the conducting coil 35(e.g. due to the torsion of the arms 75a,b). Also the arms 75 a,b may be configured to have multi-layers; a conduction coil 35 could be provided in each layer permitting more signals to be transmitted through the arms 75a,b without the need to increase the width of the arms 75a,b. This contributes to decrease the size of the overall reflective device for a given device performance. The electrically conducting coil 35 which is completely embedded in the movable element 21 is shown as a dotted line in FIG. 2b.

It should be noted that for clarity purposes, all of the layers shown in FIG. 2a are not shown in FIGS. 2b and 2c.

The moveable element 21 may further comprise a frame 28 (shown only in FIG. 2b). The holder elements 27a,b co-operate with the movable element 21 by means of the arms 75a,b which are arranged to attach to the frame 28. The frame 28 may be configured to oscillate along an oscillation axis 30 which is perpendicular to the oscillation axis 25. The frame 28 thus enables the movable element 21 to oscillate in a second direction so that the moveable element 21 can now oscillate in two dimensions. A central portion 22 of the moveable element 21 may be connected to the frame 28 by means of torsional bars 24a,b. Torsional bars 24a,b, are configured to enable the central portion 22 to oscillate about oscillation axis 25. A part of the length of the conducting coil 35 is embedded in the torsional bars 24a,b; the embedded conducting coil 35 is shown as a dotted line on the torsional bars 24a,b. It should be understood that a plurality of conducting coils 35 may be provided. Some of the conducting coils 35 could be provided on a surface of the torsional bars 24a,b and on the surface of the arms 75a,b; however, on the central portion 22 of the moveable element all conducting coils will be embedded so that a reflective layer 23 can be provided to define a whole surface of the central portion 22 so that a reflective surface 45 across the whole of the central portion 22.

Referring back to FIG. 2a it can be seen that the reflective device 20 further comprises one or more insulation layers. The embodiment shown in FIG. 2a has a first insulation layer 41 which is interposed between the silicon component 39 and the reflective layer 23. The first insulation layer 41 electrically isolates the silicon component 39 from the reflective layer 23. In addition, the first insulation layer 41 may compensate for stresses created in the movable element 21; for example, the reflective layer 23 or the coil 35 may generate a tensile stress within the movable element 21; the first insulation layer 41 may be configured to generate a compressive stress in the movable element 21 so as to compensate for the tensile stress created by the reflective layer 23 or the coil 35.

Optionally, the reflective device 20 is provided with additional insulating layers. For example, a second insulating layer (not shown) may be provided between the first insulating layer 41 and the reflective layer 23. This second insulating layer may be used to compensate for stresses created in the movable element 21, as described above.

During use current is passed through the electrically conducting coil 35. The current carrying electrically conducting coil 35 operatively co-operates with the magnetic field provided by the magnetic element 31 to effect oscillation of the moveable element 21 about the oscillation axis 25.

Laser light, comprising light pulses, each pulse defining a pixel of an image to be projected, is directed towards the reflective surface 45 of moveable element 21. As the moveable element 21 oscillates its reflective surface 45 deflects the laser light to scan the laser light across a display screen. As the light is scanned across the display surface, the pixels of the image are projected, consecutively, onto the display screen. The moveable element 21 oscillates to scan the laser light so quickly that a complete image is visible on the display screen.

The spot light size of the laser, which can be deflected by the movable element 21 is limited by the size of the reflective surface 45. The "spot light size" is the size of the laser spot, i.e. the size of the area over which the light from the laser spreads. The maximum laser spot light size which can be deflected by the reflective surface 45 is a laser spot light size which is equal to the area of the reflective surface 45. The larger the laser spot light size which can be deflected by the reflective surface 45 the higher the brightness of the projected image as more light is reflected by the reflective surface 45 to the display screen. As the electrically conductive coil 35 is completely embedded in the movable element 21, the whole upper surface 37 of the movable element 21 can be provided with a reflective surface 45 which is usable to deflect laser light; consequently this maximises the laser spot light size which can be deflected by the movable element 21. Accordingly, when used in a projection device, the reflective device 20 of the present provides for improved brightness of the projected images.

Furthermore, compared to prior art devices which have movable elements in which the whole surface of the movable element does not have a reflective surface, the present invention allows reflection of the light from a laser which has the same spot size, using a smaller sized movable element. As the movable element is smaller in size it has less inertia and therefore can be oscillated at a higher frequency using the same current. When used in a projection device, a faster frequency of oscillation of the movable element enables a higher resolution image to be projected. Alternatively, as the movable element is smaller in size it has less inertia and therefore requires less current to be oscillated at the same frequency; thus reducing the power requirement. Thus, when used in a projection device the same resolution image can be achieved using less power consumption.

FIG. 3 provides a cross-sectional view of part of reflective device 100 according to another embodiment of the present invention. The reflective device 100 has many of the same features as the reflective device 20 shown in FIGS. 2a-c and like features are awarded the same reference numerals.

The reflective device 100 shown in FIG. 3 comprises a plurality of conducting coils 35a-i embedded in the silicon component 39 of the moveable element 21. The plurality of conducting coils 35a-i are stacked to form stacks 109a-c. Each of the conducting coils 35a-i may be electrically connected in series or in parallel. It should be understood that providing one or more conducting coils which are coiled so as to define one or more stacks, is equivalent to providing a plurality of conducting coils 35a-c. Providing multiple conducting coils 35a-i, or at least providing multiple layers of conducting coils, in the moveable element 21 ensures that more force is applied to the moveable element 21 when current is passed through the conducting coils 35a-i in the presence of a magnetic field. Likewise, compared to reflective devices which have one or fewer conducting coils 35, less current is required to achieve the same movement of the moveable element 21 and consequently a lower power consumption is achieved.

An insulating layer 107 is interposed between each conducting coil 35a-i in each stack 109a-c. The insulating layers 107 may each comprise any suitable material, such as, SiO2 or SiN for example. In this particular example a portion of the length of some of the conducting coils 35a-d are arranged to be embedded in the arms 75a,b while other conducting coils 35e-i are arranged on a surface 105 of each arm 75a,b.

Figure 4:
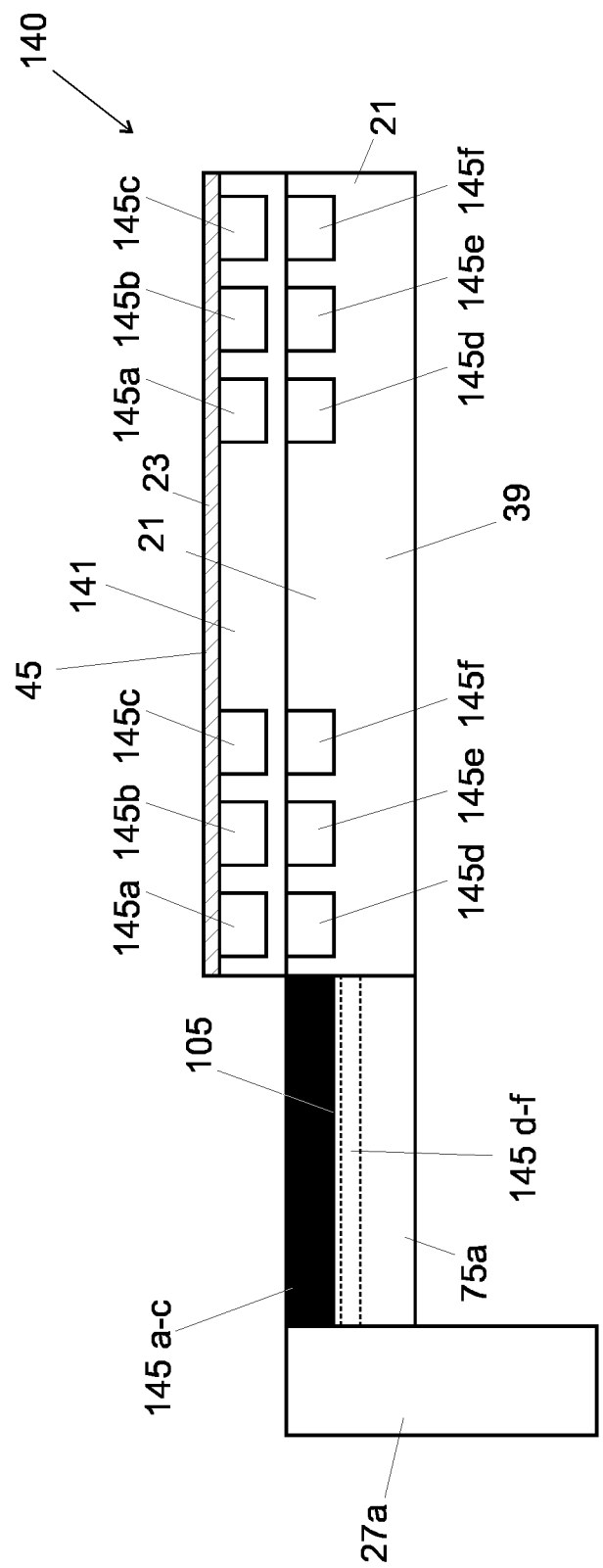
FIG. 4 provides a cross-sectional view of part of reflective device according to another embodiment of the present invention.

FIG. 4 provides a cross-sectional view of part of reflective device 140 according to another embodiment of the present invention. The reflective device 140 has many of the same features as the reflective device 100 shown in FIG. 3 and like features are awarded the same reference numerals.

The reflective device 140 comprises an insulating layer 141 which provided in the movable element 21 and is interposed between the reflective layer 23 and silicon component 39. The reflective device 140 also comprises a plurality of conducting coils 145a-f. Some of the conducting coils 145a-f, i.e. conducting coils 145 a-c, are embedded in the insulating layer 141, the remaining conducting coils 145d-f are embedded in the silicon component 39 of the moveable element 21. The insulating layer 141 is configured to electrically insulate each of the plurality of conducting coils 145a-f from one another. Advantageously, this reflective device 140 is easier to manufacture compared to the reflective device 100 shown in FIG. 3 as individual insulating layers 107 between each conducting coil 145 a-f is not required; in the reflective device 140 shown in FIG. 4 a single insulating layer 141 only is required to achieve electrical insulation of the conducting coils 145 a-f from one another.

Figure 5:
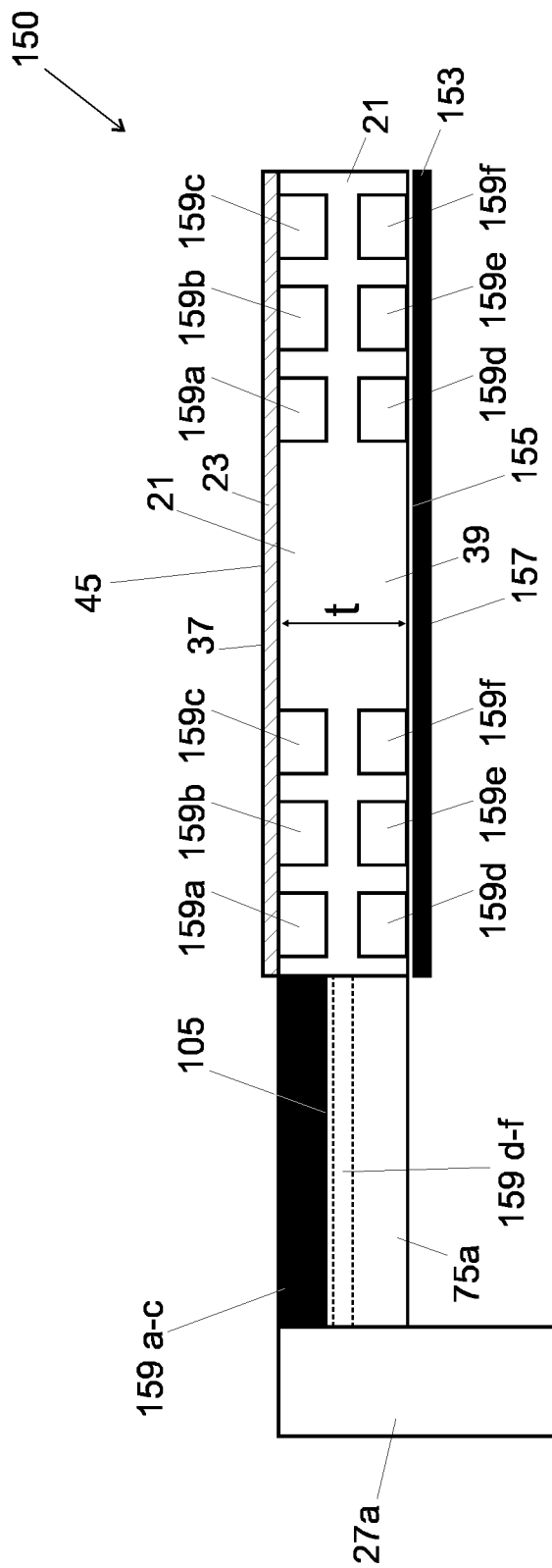
FIG. 5 provides a cross-sectional view of part of reflective device according to another embodiment of the present invention.

FIG. 5 provides a cross-sectional view of part of reflective device 150 according to another embodiment of the present invention. The reflective device 150 has many of the same features as the reflective device 140 shown in FIG. 4 and like features are awarded the same reference numerals.

As was the case for all the previous embodiments, the moveable element 21 comprises a reflective layer 23 which provides a reflective surface 45; the whole upper surface 37 of the movable element 21 is defined by the reflective layer 23 so that the whole upper surface 37 of the movable element 21 is usable to deflect light. The movable element 21 of the reflective device 150 comprises a second reflective layer 153 which provides a second reflective surface 155; the whole lower surface 157 of the movable element 21 is defined by the second reflective layer 153 so that the whole lower surface 157 of the movable element 21 is usable to deflect light.

The second reflective surface 155 can be used to optically determine the position of the moveable element 21, by using laser light and photodiode to sense the moveable element's position. The reflective device 150 may comprise a laser source (not shown) which is arranged to transmit laser light to the second reflective surface 155 of the moveable element 21, and a photodiode (not shown) which is arranged to receive light reflected from the second reflective surface 155. The intensity of light received by the photodiode is dependent of the position of the moveable element 21, therefore the position of the moveable element 21 can be determined from the light received at the photodiode It should be noted that the laser source and the photodiode may alternatively be components which are independent of the reflective device 150, but which are arranged to cooperate with the reflective device 150 so that the laser source (not shown) can transmit laser light to the second reflective surface 155 of the moveable element 21, and so that the photodiode (not shown) can receive light reflected from the second reflective surface 155.

It should be understood that the moveable element 21 in each of the above-mentioned embodiments, may define a mirror; for example the reflective moving part of a MEMS mirror. Thus in this case the reflective layer is defined by the MEMS mirror and the moveable element is defined by the frame 28 and MEMS mirror.

The reflective device 150 also comprises a plurality of conducting coils 159 a-f. The conducting coils 159 a-f are distributed through-out the thickness "t" of the silicon component 39; conducting coils 159a-c are located proximate to the upper surface 37 of the movable element 21 and conducting coils 159d-f are located proximate to the lower surface 157 of the movable element 21. The conducting coils 159 a-f may be distributed evenly through-out the thickness "t" of the silicon component 39. The conducting coils 159 a-f may be connected in series or in parallel. In this embodiment, and any of the other embodiments described above, it should be understood that the conducting coils may comprise any suitable material; in the reflective device 150 shown in FIG. 5 the conducting coils 159a-f comprise gold or copper eventually combined with some adhesion layer (Ti, TiW, Cr for example). The distribution of conducting coils 159 a-f through-out the thickness "t" of the silicon component 39 can be achieved by embedding some conducting coils 159d-f proximate the lower surface 157 of the movable element 21 and some conducting coils 159a-c proximate the upper surface 37 of the movable element 21: for example six individual conducting coils 159d-f, or three single-coiled conducting coils 159d-f, may be embedded in the silicon component 39, proximate to the lower surface 157 of the movable element 21 and six individual conducting coils 159a-c, or three single-coiled conducting coils 159a-c, may be embedded proximate the upper surface 37 of the movable element 21; alternatively it could be achieved by embedding a multiple-coiled first conducting coil into the silicon component 39, proximate the lower surface 157 of the movable element 21, and embedding a second multiple-coiled conducting coil into the silicon component 39 proximate the upper surface 37 of the movable element 21.

Distributing the conducting coils 159a-f throughout the thickness of the moveable element 21, reduces the amount of warping of moveable element 21. When the conducting coils 159a-f cooperate with a magnetic field they apply a force to the movable element 21 which causes the moveable element 21 to oscillate; since the conducting coils 159a-f are distributed through-out the moveable element 21, the force applied by the conducting coils 159a-f to the moveable element 21 is distributed evenly across the moveable element 21 thus reducing the occurrence of warp. More importantly by distributing the conducting coils 159a-f throughout the thickness of the moveable element 21, this decreases the resistance of the conducting coils 159a-f and improves the power consumption and/or increased the t amount of conducting coils 159a-f which can be provided in the moveable element; an increase in the amount of conducting coils 159a-f provided in the moveable element 21 results in an increase in the force applied to the moveable element 21 when the conducting coils 159a-f conduct current in a magnetic field.

It should be noted that in each of the above-mentioned embodiments, the reflective layer(s) 23,153 can be configured to have certain characteristic and/or materials. For example, the reflective layer(s) 23,153 can be configured to have one or more diffractive gratings; may be configured to act as an optical filter formed by a single or multi-semi-transparent layer (as Bragg filter etc). The reflective layer(s) 23,153 may comprise photonic crystals (these are periodic dielectric or metallo-dielectric nanostructures that affect the propagation of electromagnetic waves (EM)), and can for example be used as optical filter or waveguide.

Figure 6A:
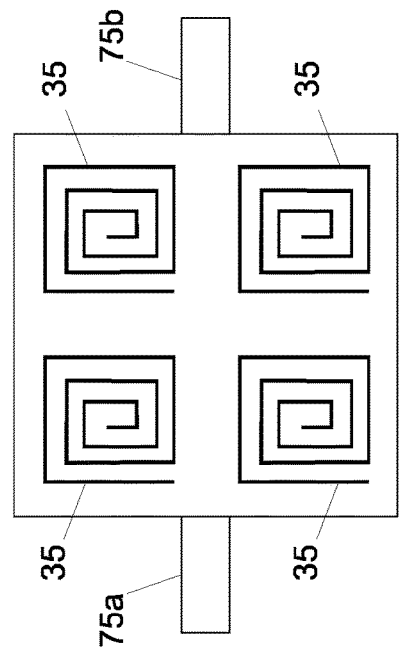
FIGS. 6a-c provide aerial views of cross sections of possible moveable elements which could be used in a reflective device according to the present invention.
Figure 6B:
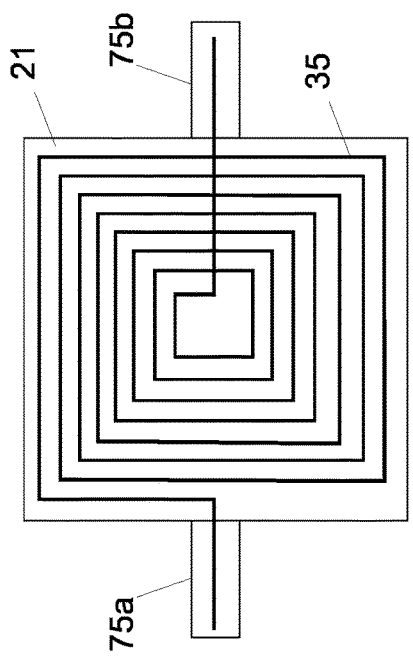
Figure 6C:
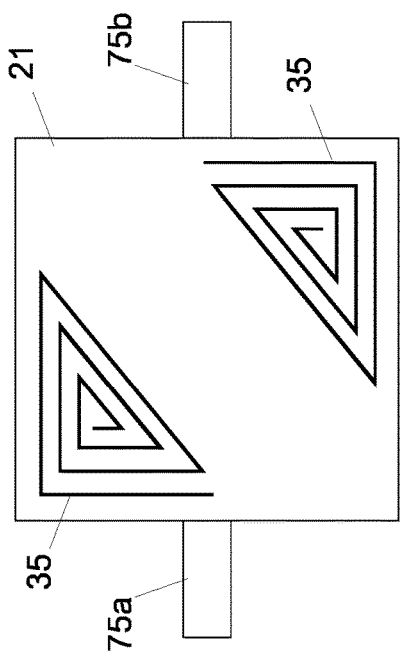

FIGS. 6a-c provide aerial views of a cross section of possible moveable elements 21 which could be used in any of the above-mentioned reflective devices. The conduction coil(s) 35 are visible; it should be remembered that the conductions coil(s) 35 are embedded in the moveable element 21 and therefore are only visible in FIGS. 6a-c since FIGS. 6a-c provide an aerial view of a cross section of the moveable element 21. As can be seen in FIGS. 6a-c, in each configuration the conductions coil(s) 35 are arranged to spread across substantially the whole cross sectional area of the moveable element 21.

The arms 75a,b can be designed for anti-reflection, by applying for example anti-reflective coatings or black silicon or Bragg mirror to the arms 75*a,b*. Configuring the arms 75*a,b* so that they do not reflection light will ensure that only the reflective surface of the moveable part 21 will reflect light; thus less parasitic reflective light will be generated. As the arms 75*a,b* are made of silicon and because there is the metal coil (conductive coils) passing through them, they can reflect light (the light reflected from the arms 75*a,b* is parasitic light). Therefore one way to avoid such parasitic light, is to provide the arms 75*a,b* with an anti-reflective coating or so-called black-silicon or bragg mirror structure/ films can be applied on the arms 75*a,b*. The frame 28 may also be provided with an anti-reflective coating or so-called black-silicon or bragg mirror structure/films so the frame 28 does not generate parasitic light.

Figure 7A:
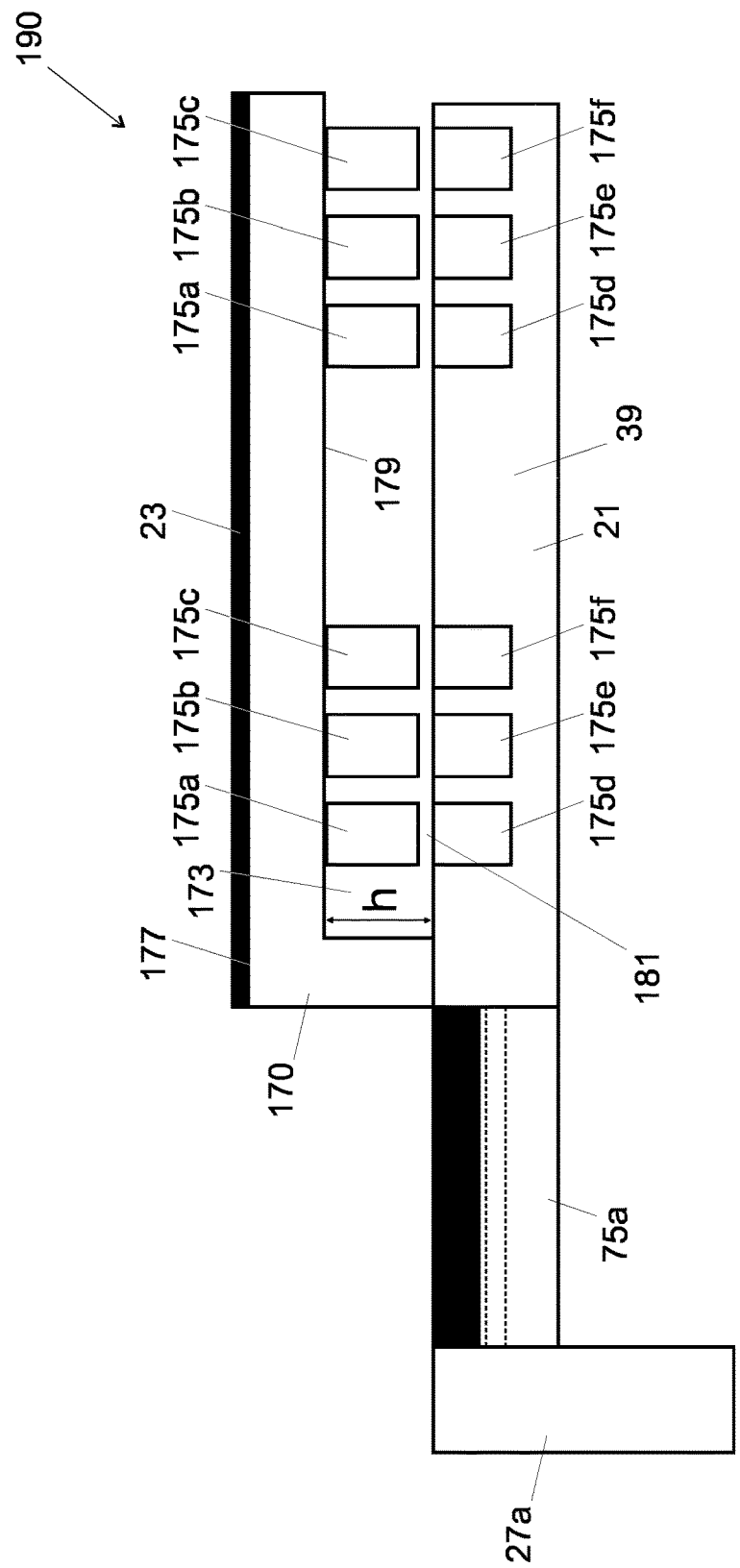
FIGS. 7a and 7b each provide cross-sectional views of part of reflective devices according to further embodiments of the present invention.
Figure 7B:
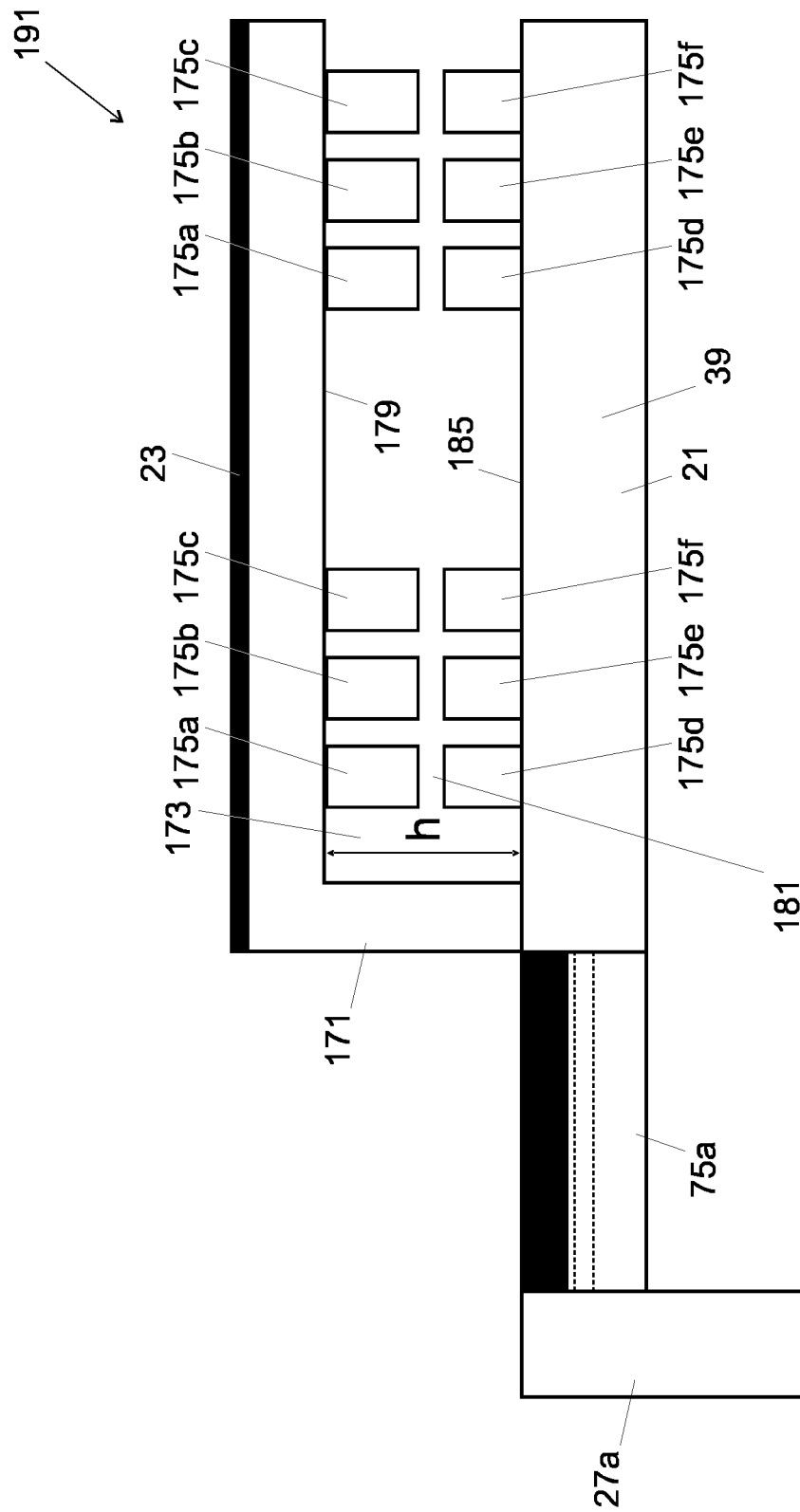

FIGS. 7*a* and 7*b* each provide cross-sectional views of part of reflective devices 190,191 according to further embodiments of the present invention. The reflective devices 190,191 shown in FIGS. 7*a* and 7*b* respectively, have many of the same features as the reflective device 140 shown in FIG. 4 and like features are awarded the same reference numerals.

The reflective device 190 shown in FIG. 7*a* further comprises a spacer element 170. The spacer element 170 is supported on the moveable element 21 i.e. the moveable element 21 comprises the spacer element 170. The spacer element 170 is interposed between the silicon element 39 and the reflective layer 23. The spacer element 170 is dimensioned to have more or less the same length and width as the moveable element 21. The spacer element 170 defines a cavity 173 in which three single-coiled conducting coils 175*a-c* are housed; the three conducting coils 175*a-c* are attached to an inner surface 179 of the spacer element 170. A further three single-coiled conducting coils 175*d-f* are embedded in the silicon component 39. The spacer element 170 is configured such that an inner height "h" of the cavity 173 is sufficient such that an air gap 181 exists between the three conducting coils 175*a-c* which are attached to an inner surface 179 of the spacer element 170 and the three conducting coils 175*d-f* which are embedded in the silicon component 39. The reflective layer 23 is provided on an outer surface 177 of the spacer element 170.

Alternatively no air gap 181 may be provided between the coils; and the three conducting coils 175*a-c* which are attached to an inner surface 179 of the spacer element 170 and the three conducting coils 175*d-f* which are embedded in the silicon component 39 may abut each other.

The reflective device 191 shown in FIG. 7*b* has many of the same features as the reflective device 190 shown in FIG. 7*a* and like features are awarded the same reference numerals. In the reflective device 191 none of the conducting coils 175*a-f* are embedded in the silicon component 39; instead the three single-coiled conducting coils 175*a-c* are attached to an inner surface 179 of a spacer element 171 and the three single-coiled conducting coils 175*d-f* are attached to an upper surface 185 of the silicon component 39. In this embodiment the spacer element 171 is configured such that the inner height "h" of the cavity 173 is sufficient such that an air gap 181 exists between the three conducting coils 175*a-c* which are attached to an inner surface 179 of the spacer element 171 and the three conducting coils 175*d-f* which are attached to a surface 185 in the silicon component 39. The spacer element 171 is supported on the moveable element 21 i.e. the moveable element 21 comprises the spacer element 170. The spacer element 171 is interposed between the silicon element 39 and the reflective layer 23.

In each of the embodiments shown in FIGS. 7*a* and 7*b* the conducting coils 175*a-f* may be connected in series or in parallel.

It should be noted that each of the embodiment shown in FIGS. 3-7*b* can have each of the layers shown in FIG. 2*a*; however for clarity purposes most of these layers are not illustrated in the FIGS. 3-7*b*.

According to a further aspect of the present invention there is provided a method of manufacturing reflective device which comprises a movable element which can oscillate about at least one oscillation axis to scan light. This method involves the following steps:

providing a substrate;

embedding one or more electrically conductive means in substrate;

providing a reflective material on the substrate to provide the substrate with a reflective surface.

The reflective surface may be arranged to overlay the one or more electrically conductive means.

The substrate may then be processed to define a moveable element and a one or more holding members which co-operate with the movable element to hold the movable element in a manner which will allow the movable element to oscillate about at least one oscillation axis to scan light. The one or more holder elements may be configured to define a region which can receive at least a portion of the movable element as the movable element oscillates when the reflective device is mounted on a surface.

Embedding the one or more electrically conductive means in the substrate may be achieved a number of different ways. For example, one or more channels may be provided in the substrate and the one or more electrically conductive means may then be provided in the one or more channels. Any suitable means may be used to provide an electrically conducting means in the one or more channels; for example electro-deposition of copper or of an alloy containing copper; electro-deposition of gold or of an alloy containing gold; electroplating of copper or of an alloy containing copper; electroplating of gold or of an alloy containing gold; sputtering of copper or of an alloy containing copper; sputtering of gold or of an alloy containing gold; evaporation of copper or of an alloy containing copper; evaporation of gold or of an alloy containing gold; carbon nanotube deposition; or growing of a conducting means.

FIGS. 8*a*-8*i* illustrates the steps involved in a particular embodiment of a method of manufacturing a reflective device according to the present invention.

Figure 8A:
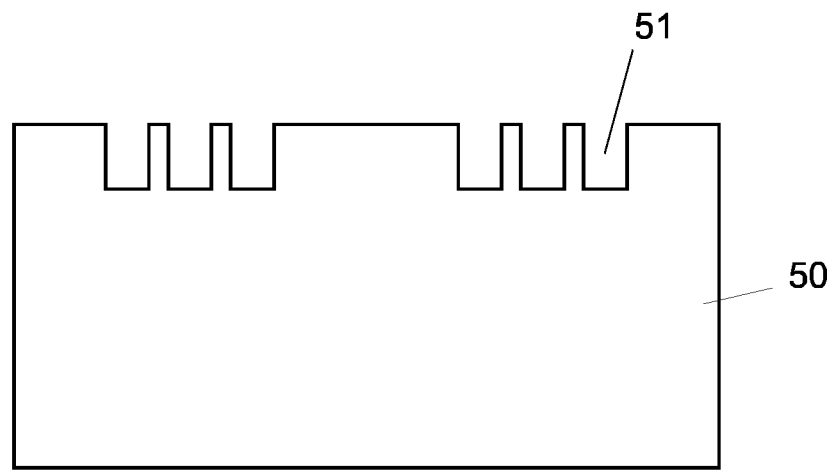
FIGS. 8a-8i illustrate the steps involved in a particular embodiment of a method of manufacturing a reflective device according to the present invention.

As illustrated in FIG. 8*a* the method involves, providing a silicon wafer 50 (or a SOI wafer) and defining one or more channels 51 in the silicon wafer 50. In this particular example photolithography and silicon etching (dry and/or wet etching) is used to define the one or more channels 51 in the silicon wafer, however it will be understood that any other suitable method could be used (for example, hard mask deposition, patterning and subsequently etching).

Figure 8B:
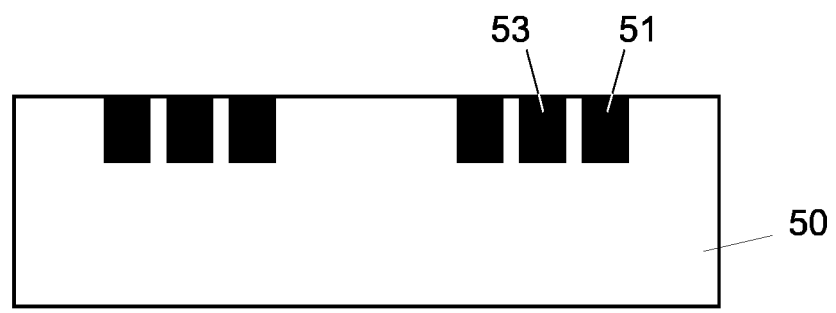

Once the one or more channels 51 have been defined in the silicon wafer 50, an electrically conducting means, in the form of an electrically conductive coil 53, is provided in the one or more channels 51 (FIG. 8*b*). In this particular example electro-deposition of copper is use to provide an electrically conductive coil 53 in the one or more channels 51. It should be understood that any suitable electrically conducting means could be used, and the electrically conducting means may comprise any suitable material, for example, copper, gold, and/or carbon or any alloy comprising of one or more of these materials. It should also be noted that any suitable means may be used to provide an electrically conducting means in the one or more channels 51; electro-deposition of copper or of an alloy containing copper; electro-deposition of gold or of an alloy containing gold; electroplating of copper or of an alloy containing copper; electroplating of gold or of an alloy containing gold; sputtering of copper or of an alloy containing copper; sputtering of gold or of an alloy containing gold; evaporation of copper or of an alloy containing copper; evaporation of gold or of an alloy containing gold; carbon nanotube deposition; or growing of a conducting means.

Next the silicon wafer 50 and electrically conducting coil 53 is polished. Any suitable polishing method may be used; in this particular example Chemical Mechanical Polishing is used.

Figure 8C:
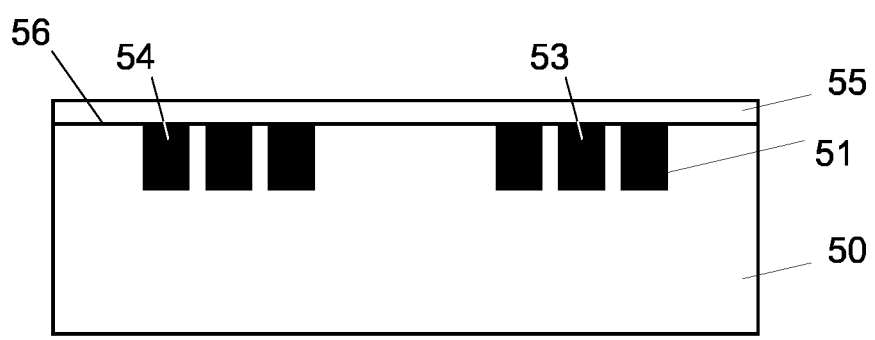
Figure 8D:
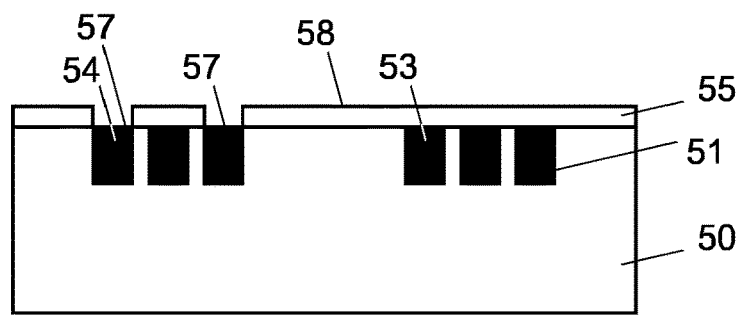

Following polishing an insulating material is deposited on a surface 56 of the silicon wafer 50 and on a surface 54 of the electrically conducting coil 53 to form a first insulating layer 55 (FIG. 8c). Any suitable insulating material may be used. In this particular example, an insulating material comprising Silicon Oxide and/or Silicon Nitride is deposited on the surface 56 of the silicon wafer 50 and on the surface 54 of the electrically conducting coil 53 to form a first insulating layer 55 which comprises Silicon Oxide and/or Silicon Nitride.

Figure 8E:
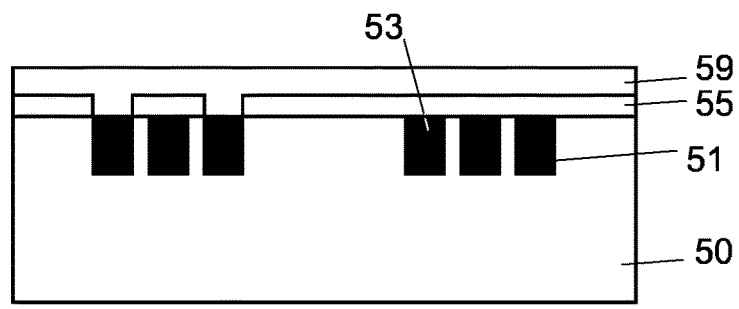

The first insulating material 55 is then patterned (using, for example, photolithography and etching) to expose portions 57 of the electrically conducting coil 53 (FIG. 8d); and a metallic material is deposited on a surface 58 of the first insulating layer 55 and on a surface 54 of the exposed portions 57 of the electrically conducting coil 53, to form a metal layer 59 (FIG. 8e). The metallic material may comprise any suitable element, for example the metallic material may comprise Copper, Gold, Aluminium, Tungsten, Titanium, or an alloy comprising one or more of these elements.

Figure 8F:
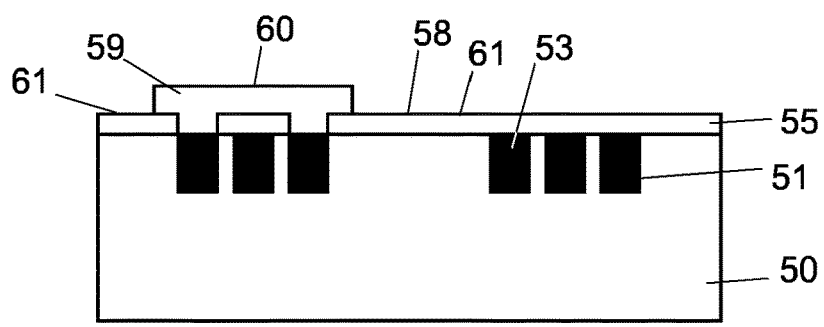

The metal layer 59 is then patterned (using, for example, photolithography and etching) to expose portions 61 of the first insulating layer 55 (FIG. 8f).

Figure 8G:
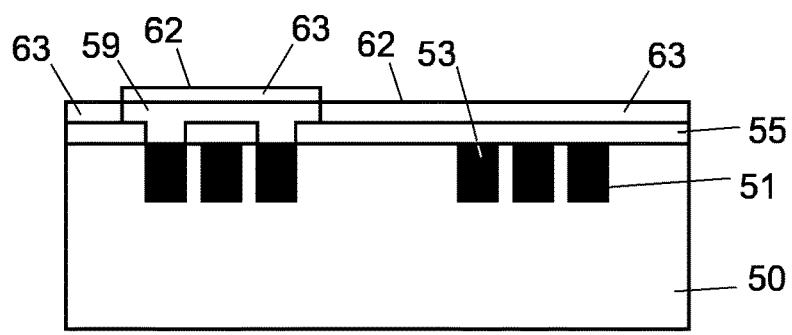

Reflective material is then deposited on a surface 60 of the metal layer 59 and on the surface 58 of the exposed portions 61 of the first insulating layer 55, to form a reflective layer 63 (FIG. 8g). The reflective material may comprise any suitable elements. For example, the reflective material may comprise Aluminium, Silver, Gold, Tungsten, and or Titanium, or an alloy comprising any of these elements.

Figure 8H:
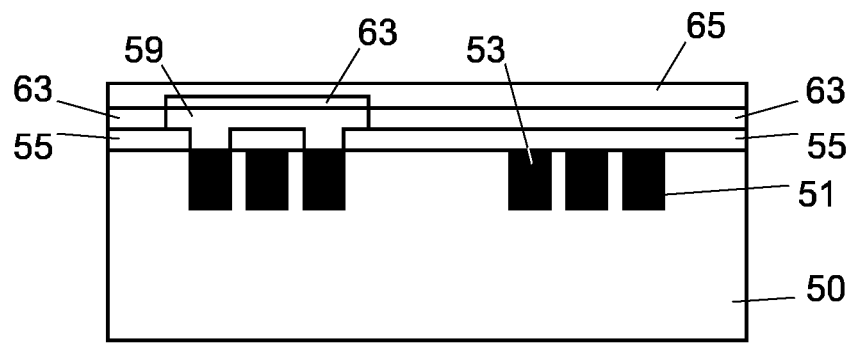

A protective layer 65 is deposited on a surface 62 of the reflective layer 63 (FIG. 8h). This will ensure that the reflective layer 63 is less prone to scratching. The protective layer 65 may be a protective insulation layer. The protective layer 65 may comprise Silicon Oxide and/or Silicon Nitride.

Figure 8I:
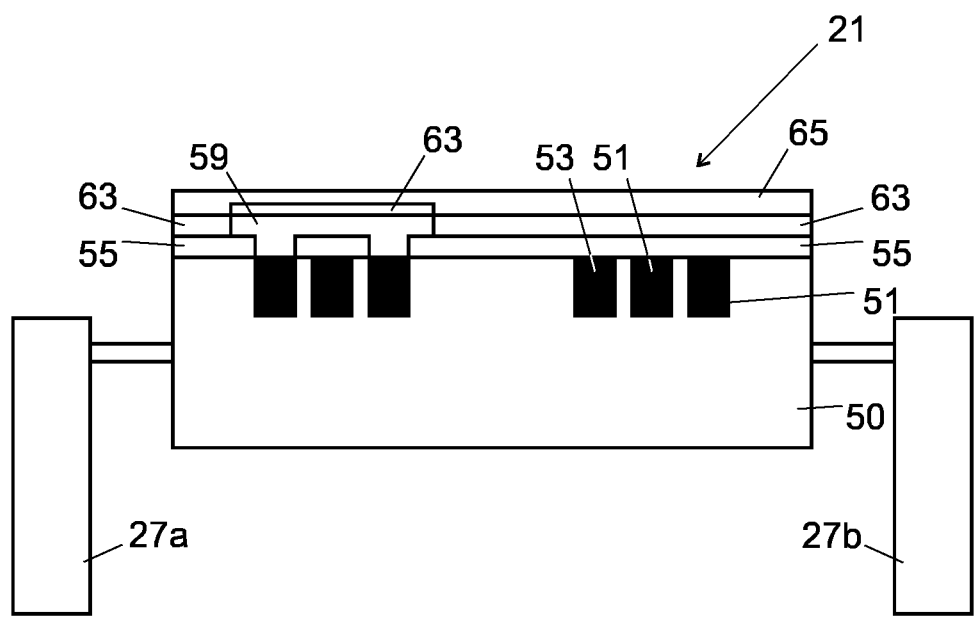

The silicon wafer 50 (and the layers thereon) is then etched (dry and/or wet etching) from a front-side thereof and from a back-side thereof to define a movable element 21 and one or more holder elements 27a, 27b (FIG. 8i). If the wafer 50 in question is a silicon wafer then silicon etching is sufficient, if however the wafer 50 is an SOI wafer etching of the silicon oxide layer provided therein may also be required in order to define the movable element 21 and the one or more holder elements 27a, 27b.

Optionally, a second insulation layer may be deposited on the metal layer 59 and the exposed portions 61 of the first insulating layer 55. The second insulation layer will thus be interposed between the reflective layer 63 and the metal layer 59 and interposed between the reflective layer 63 and the exposed portions 61 first insulating layer 55. The second insulation layer can be used to balance stresses and strains generated in the movable element 21 by the other layers. The second insulation layer may comprise any suitable material. For example, the second insulation layer may comprise Silicon Oxide and/or Silicon Nitride. Optionally this second insulated layer can be polished by means of Chemical Mechanical Polishing (CMP) before deposition of the reflective layer 63. This enables a perfectly flat reflective surface to be achieved.

If a second insulating layer is provided, then it will be necessary to deposit the reflective material on a surface of the second insulating layer, to form the reflective layer 63.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A reflective device comprising:
    a movable element to oscillate about at least one oscillation axis, the movable element comprising:
        a substrate having a reflective layer provided on an upper surface of the substrate to scan light as the movable element oscillates; and
    one or more arms coupled to the reflective layer;
    one or more holder elements coupled to the one or more arms of the movable element to hold the movable element, the one or more holder elements comprising a region to receive at least a portion of the movable element as the movable element oscillates; and
    a plurality of coils embedded within the substrate and embedded in at least a portion of the one or more arms, the plurality of coils to co-operate with a magnetic field to effect oscillation of the movable element, the plurality of coils completely embedded in an upper half of the substrate, below the reflective layer, and extending to a depth within the substrate from the upper surface of the substrate.

2. The reflective device according to claim 1, further comprising one or more insulation layers to compensate for stresses created by the reflective layer.

3. The reflective device of claim 2, wherein one of the one or more insulation layers is disposed between the reflective layer of the substrate.

4. The reflective device of claim 2, comprising a plurality of insulation layers, a first one of the plurality of insulation layers disposed between the reflective layer of the substrate and a second one of the plurality of insulation layers disposed proximate to the plurality of coils.

5. The reflective device according to claim 1, the movable element comprising a spacer element disposed below the reflective layer, the spacer element to define a cavity between the substrate and the reflective layer, the plurality of coils disposed within the cavity.

6. The reflective device of claim 1, comprising a magnetic element to provide the magnetic field.

7. A projection device comprising:
    a reflective device, the reflective device comprising:
    a movable element to oscillate about at least one oscillation axis, the movable element comprising:
    a substrate having a reflective layer provided on an upper surface of the substrate to scan light as the movable element oscillates; and
    one or more arms coupled to the reflective layer;
    one or more holder elements coupled to the one or more arms of the movable element to hold the movable element, the one or more holder elements comprising a region to receive at least a portion of the movable element as the movable element oscillates;

a magnetic element to provide a magnetic field;

a plurality of coils embedded within the substrate and embedded in at least a portion of the one or more arms, the plurality of coils to co-operate with the magnetic field provided by the magnetic element to effect oscillation of the movable element, the plurality of coils completely embedded in an upper half of the substrate below the reflective layer, and extending to a depth within the substrate from the upper surface of the substrate; and a laser, the laser to emit a light beam to be scanned by the reflective layer.

8. The projection device according to claim 7, further comprising one or more insulation layers to compensate for stresses created by the reflective layer.

9. The projection device of claim 8, wherein one of the one or more insulation layers is disposed between the reflective layer of the substrate.

10. The projection device of claim 8, comprising a plurality of insulation layers, a first one of the plurality of insulation layers disposed between the reflective layer of the substrate and a second one of the plurality of insulation layers disposed proximate to the plurality of coils.

11. The projection device according to claim 7, the movable element comprising a spacer element disposed below the reflective layer, the spacer element to define a cavity between the substrate and the reflective layer, the plurality of coils disposed within the cavity.

12. A method of manufacturing a reflective device, the method comprising:

providing a substrate;

etching the substrate to define a movable element to oscillate about at least one oscillation axis to scan light, and to define one or more holder elements to co-operate with the movable element to hold the movable element to allow the movable element to oscillate about the at least one oscillation axis;

embedding completely a plurality of electrically conductive coils in an upper half of the substrate, the plurality of coils extending from an upper surface of the substrate to a depth within the substrate; and depositing a reflective material onto the upper surface of the substrate to form a reflective layer, the reflective layer arranged to overlay the plurality of electrically conductive coils.

13. The method according to claim 12, comprising:

providing one or more channels in the substrate;

providing the plurality of electrically conductive coils in the one or more channels.

14. The method according to claim 12, wherein the one or more holder elements define a space in which the movable element can oscillate when the reflective device is mounted on a surface.

15. The method of claim 14, comprising providing a magnetic element to provide a magnetic field to co-operate with the plurality of electrically conductive coils to effect oscillation of the movable element.

16. The method of claim 12, comprising:

depositing insulating material onto the first surface of the substrate to form an insulation layer disposed between the reflective layer of the substrate.

17. The method of claim 12, comprising:

depositing insulating material onto the first surface of the substrate to form a first insulation layer disposed between the reflective layer of the substrate; and depositing insulating material onto the substrate to form a second insulation layer disposed proximate to the plurality of coils.

* * * * *